United States Patent
Johnson

(10) Patent No.: US 8,373,432 B2
(45) Date of Patent: Feb. 12, 2013

(54) AUTOMATED TEST EQUIPMENT EMPLOYING TEST SIGNAL TRANSMISSION CHANNEL WITH EMBEDDED SERIES ISOLATION RESISTORS

(75) Inventor: Gerald H. Johnson, Andover, MN (US)

(73) Assignee: Teradyne Inc., North Reading, MA (US)

( * ) Notice: Subject to any disclaimer, the term of this patent is extended or adjusted under 35 U.S.C. 154(b) by 564 days.

(21) Appl. No.: 12/724,727

(22) Filed: Mar. 16, 2010

(65) Prior Publication Data

US 2010/0259277 A1   Oct. 14, 2010

Related U.S. Application Data

(60) Provisional application No. 61/168,034, filed on Apr. 9, 2009.

(51) Int. Cl.
  *G01R 31/00* (2006.01)
  *G01R 31/20* (2006.01)
  *G01R 31/02* (2006.01)
(52) U.S. Cl. .......... 324/756.05; 324/754.07; 324/762.01
(58) Field of Classification Search ............ 324/754.07, 324/756.03–756.07, 762.01
  See application file for complete search history.

(56) References Cited

U.S. PATENT DOCUMENTS

| | | | |
|---|---|---|---|
| 4,928,246 A * | 5/1990 | Crawley et al. ............... 700/8 |
| 5,142,449 A | 8/1992 | Littlebury et al. | |
| 6,275,962 B1 | 8/2001 | Fuller et al. | |
| 6,400,173 B1 * | 6/2002 | Shimizu et al. .......... 324/754.07 |
| 6,476,628 B1 | 11/2002 | LeColst | |
| 7,276,922 B2 * | 10/2007 | Miller et al. ............. 324/754.07 |
| 7,649,366 B2 * | 1/2010 | Henson et al. ........... 324/754.03 |
| 7,847,572 B2 * | 12/2010 | Watanabe et al. .......... 324/750.3 |
| 7,872,488 B2 * | 1/2011 | Kang ....................... 324/762.02 |
| 2002/0163333 A1 * | 11/2002 | Schlicker et al. ............. 324/242 |
| 2003/0110428 A1 | 6/2003 | Ochoa et al. | |
| 2003/0169061 A1 | 9/2003 | Miller et al. | |
| 2003/0197500 A1 | 10/2003 | Saulnier et al. | |
| 2003/0210031 A1 | 11/2003 | Miller | |
| 2003/0210067 A1 | 11/2003 | Miller | |
| 2004/0111657 A1 | 6/2004 | Choi | |
| 2004/0174174 A1 | 9/2004 | Sinsheimer et al. | |
| 2005/0237073 A1 | 10/2005 | Miller et al. | |
| 2006/0097736 A1 | 5/2006 | Oldrey | |
| 2007/0296422 A1 * | 12/2007 | Miller .......................... 324/754 |
| 2008/0024143 A1 | 1/2008 | Miller et al. | |

* cited by examiner

*Primary Examiner* — Joshua Benitez Rosario
(74) *Attorney, Agent, or Firm* — BainwoodHuang

(57) ABSTRACT

Automated test equipment for high-speed testing of devices under test (DUTs) includes a tester channel circuit generating a high-speed electrical test signal applied to the signal input terminal of each DUT, and a contacter board in physical and electrical contact with the DUTs. The contacter board has a high-speed signal transmission channel including (1) an electrical contact at which the high-speed electrical test signal is received, (2) conductive etch extending from the electrical contact to isolation areas each adjacent to the signal input terminal of a respective DUT, and (3) an embedded series isolation resistor formed on an inner layer of the contacter board at a respective isolation area forming a connection between the conductive etch and the adjacent signal input terminal of the respective DUT.

20 Claims, 6 Drawing Sheets

AUTOMATED TEST EQUIPMENT EMPLOYING TEST SIGNAL TRANSMISSION CHANNEL WITH EMBEDDED SERIES ISOLATION RESISTORS

SUMMARY

In the testing of electronic devices such as semiconductor memories, it can be desirable to use a single automated test equipment (ATE) signal channel to drive a relatively large number of "loads" (terminals of devices under test (DUTs)). The parasitic capacitance of the package and die of the memory devices can cause reflections on signal transmission etch that create poor signal quality and prevent proper test functionality. As test speeds get higher and higher in frequency (e.g. 1.33 Gb/s) the signal quality may get further degraded by the reflections. To address this problem, a series resistor can be placed at the input terminal of each DUT to isolate the loading effects from each load. However, using common discrete surface mount resistors may not work effectively, because they are relatively large and necessarily placed relatively far from the DUT input pins, causing additional stub lengths and more reflections. To be most effective, the series resistors should be very close to the input pins. Using thin-film resistors embedded in an interface printed circuit board (PCB) allows this close placement. Since there is little or no DC current flow in these resistors and therefore minimal power dissipation, they can be very small and fit into a pinout pattern (e.g. ball grid array or BGA) of the high pin density DUTs. This reduces the reflections to the point where a single tester channel can drive several DUT loads, for example an address or command pin for eight high-speed memory devices, which enables the testing or more DUTS in parallel for a given amount of tester channel card resources, reducing per-device testing costs in volume testing applications.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

Figure 1:
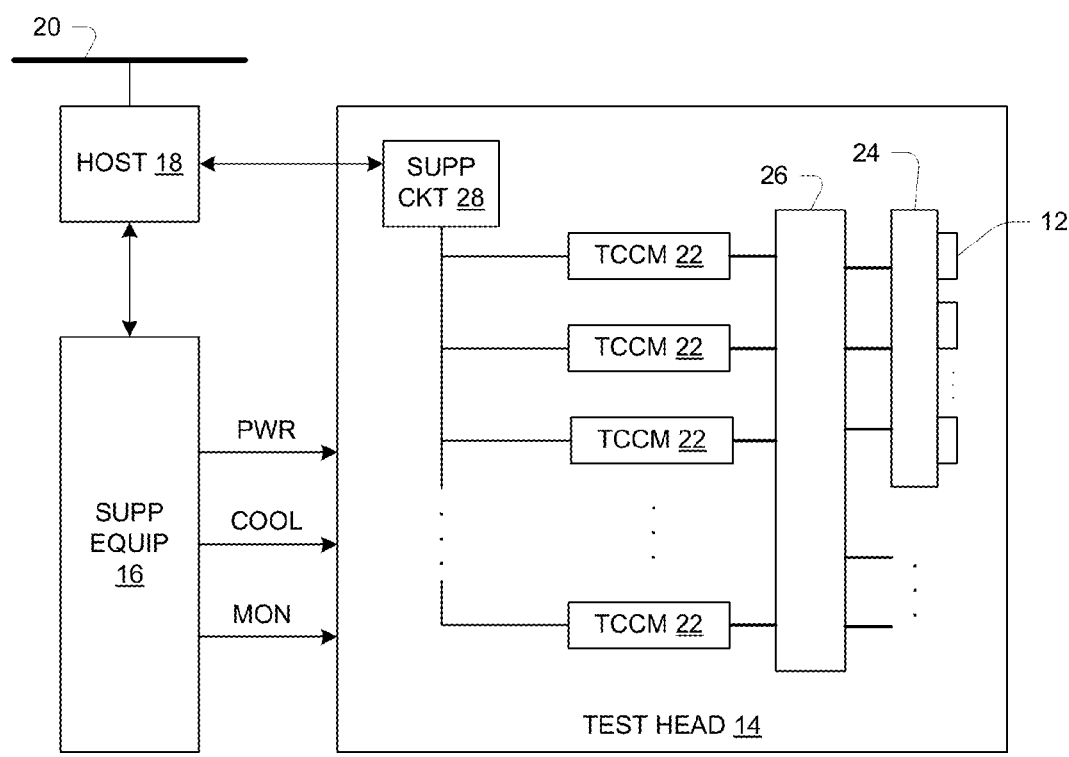
FIG. 1 is a block diagram of an integrated circuit test system.

FIG. 1 shows a tester system 10 for testing integrated circuits such as high-speed synchronous dynamic random-access memory (SDRAM) devices, shown as devices under test (DUTs) 12. The tester system 10 includes a test head 14, support equipment (SUPP EQUIP) 16 and a host computer (HOST) 18, which may be connected to a network 20 for communications with other test-related equipment. As shown, the support equipment 16 may provide various general resources including power (PWR), cooling (COOL) and functional monitoring (MON) to/of the test head 14, under high-level control of the host 18. The test head 14 includes a plurality of tester channel circuit modules (TCCMs) 22, DUT contacter boards (or contacter boards) 24, an interposer 26, and support circuitry (SUPP CKT) 28. The DUTs 12 are in physical and electrical contact with the contactor boards 24, such as for example by placement into integrated circuit (IC) sockets affixed to the contactor boards 24. Each TCCM 22 includes a plurality of tester channel circuits (TCCs), each of which generates a single high-speed test signal.

Under control of the support circuitry 28, the TCCs of each TCCM 22 generate high-speed test signals for application to the DUTs 12, and the TCCM 22 also receives and samples signals generated by the DUTs 12. The signals are carried by interconnections provided by the interposer 26 and contacter boards 24. In one embodiment, the interposer 26 may include a plurality of coaxial cables with suitable connectors on each end to connect to the TCCs 22 and contacter boards 24.

The DUTs 12 are packaged integrated circuit (IC) devices, such that each packaged IC device includes a semiconductor IC and a package providing both mechanical mounting and external connections for the semiconductor IC. Common materials for the package include plastic and ceramic as generally known in the art. The external connections include signal input terminals each exhibiting package parasitic reactance—small amounts of capacitance and inductance associated with the connection from the exterior terminal to an I/O pad of the IC. At sufficiently high testing speeds, this package parasitic reactance can affect signal quality, and so it should be taken into consideration from a signal integrity perspective.

Figure 2:
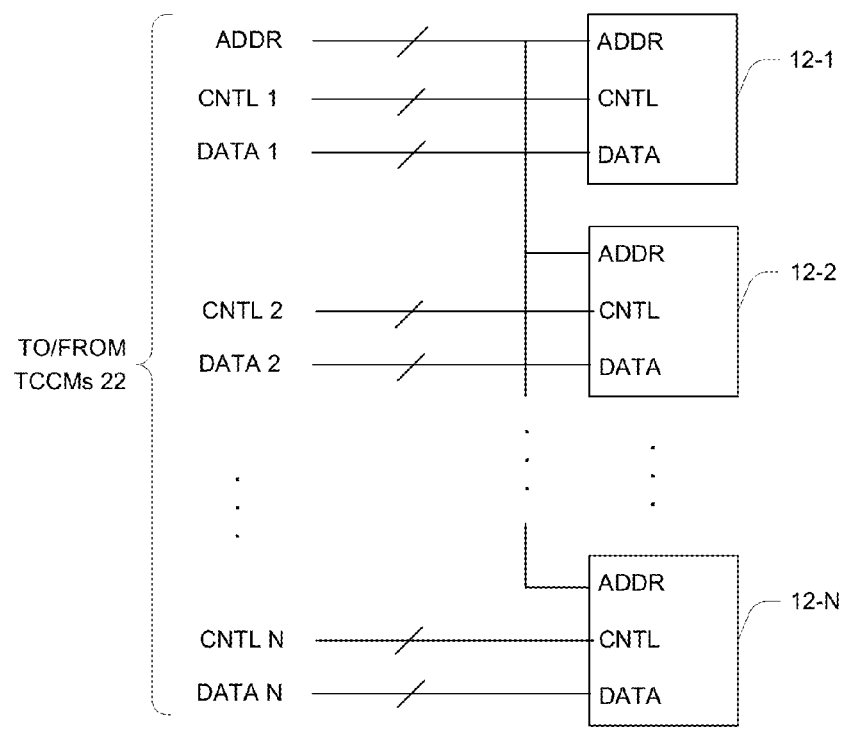
FIG. 2 is block diagram showing connections to a plurality of devices under test (DUTs)

FIG. 2 shows a logical or functional view of the connections between the TCCs 22 of FIG. 1 and the DUTs 12. In the illustrated example the DUTs 12 are SDRAM devices each having various electrical interface terminals including address terminals (ADDR), control terminals (CNTL), and data terminals (DATA). It will be appreciated that typically the address and at least some control terminals are input-only (i.e., external devices drive address and control signals into the SDRAMs 12), while for different types of devices the data terminals may be bidirectional (used for both input and output) or there may be separate input and output data terminals. The various terminals of the DUTs 12 are connected to receive corresponding high-speed test signals from the TCCs 22. In the illustrated arrangement, the test signals are labeled ADDR for address, CNTL n for control, and DATA n for the data to/from each DUT 12. The address test signals ADDR are supplied to each of the DUTs 12, whereas each set of control and data test signals CNTL n, DATA n is specific to only a corresponding single DUT 12 (i.e., DATA 1 is specific to DUT 12-1, etc.).

During a testing operation, the DUTs 12 are tested simultaneously in a parallel testing operation. In any given signaling interval, all the DUTs 12 receive the same address signals on their address terminals. Either the same or different data can be written to or read from the DUTs 12 via the data terminals under the control of the control signals. This parallel operation provides for greater testing efficiency than might be the case if the DUTs 12 could only be tested sequentially or only in smaller parallel groups. There is a tradeoff, however, as parallel operation generally entails a larger number of simultaneously generated test signals. For certain types of DUTs, greater parallel testing is possible in part because of the ability to share signals (such as address signals) among all the DUTs simultaneously. In the illustrated arrangement, the single set of address test signals is shared among all the DUTs 12, rather than utilizing one set for each DUT 12 for example. By sharing test signals among several DUTs 12, a reduced number of tester channels can be used to test a given number of DUTs 12, enhancing test efficiency.

Notwithstanding the above, a given test signal generally cannot be shared with an arbitrarily large number of DUTs 12. Modern devices operate at very high-speeds and require test signals having signaling rates on the order of 1 Gb/s or higher, and "edge rates" or signal transition times less than 100 picoseconds (ps). At these signaling and edge rates, it becomes a challenge to distribute a single test signal to numerous loads distributed over more than a few square inches of area, because transmission line effects such as reflections can create substantial noise on the signals and interfere with precise timing and signal level measurements that need to occur as part of the testing. As an example, in one commercial tester only four DUTs 12 are allowed to share a single high-speed test signal, in order to maintain adequate signal quality for proper testing operation. It will be appreciated that when substantially more than four DUTs 12 are to be tested in parallel, a number of tester channels have to be allocated to each set of four DUTs 12, requiring a large number of channels for parallel testing operation.

Figure 3:
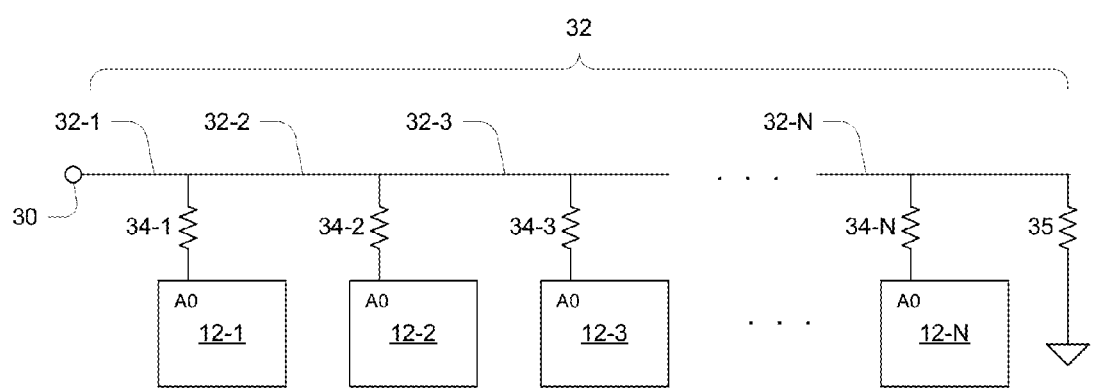
FIG. 3 is a schematic diagram of a test signal transmission channel on a contacter board.

FIG. 3 shows an arrangement that can be utilized to increase the number of DUTs 12 that can share high-speed test signals while maintaining adequate signal quality for proper testing operation. The schematic of FIG. 3 shows circuitry for a single test signal, such as an address signal identified as "A0". The circuitry is included on the contacter board 24. It will be appreciated that this circuitry would be repeated for many/all of a larger number of test signals in a tester system, in order to minimize the number of tester channel circuits required to test a given number of DUTs 12 in parallel. As an example with reference to FIG. 2, this circuitry would preferably be repeated for at least each of the address test signals ADDR.

Referring again to FIG. 3, a high-speed test signal is received at a connection point or contact 30 to which a corresponding conductor/terminal of the interposer 26 (FIG. 1) is connected. Conductive etch 32 (having segments 32-1, 32-2 etc. as shown) is connected to the contact 30 and to each of the DUTs 12-n via respective series isolation resistors 34-n. The contact 30, etch 32 and series isolation resistors 34 form a high-speed signal transmission channel that conveys the high-speed test signal to all the DUTs 12. The etch 32 is terminated at one end by a termination resistor 35, whose resistance preferably is chosen to be equal in value to the effective impedance of the etch 32 and associated loads on the etch 32.

Each series isolation resistor 34 is preferably located as close as possible to the corresponding DUT 12, in particular as close as possible to the specific terminal (e.g., A0) of the corresponding DUT 12. Additionally, given the high counts and close spacing of the terminals of modern DUTs 12, it is important that the series isolation resistors 34 be as small as possible. For this reason, they are preferably formed as so-called "embedded" resistors, which may be realized for example as very small sections of resistive material formed on inner layers of the contacter board 24 during its fabrication. More information about embedded resistors is provided below. In one embodiment, embedded resistors of a suitable size can be made having resistance values in the range of 20-30 ohms for example, and more generally less than 50 ohms. The isolation resistors 34 should be high enough in value to significantly reduce undesired reflections and thereby enable more DUTs 12 to share a single high-speed test signal, yet small enough in value to not adversely effect the signal directly delivered through them to the isolated DUTs 12. Not all isolation resistors 34 need be the same value. For example, it may be desirable that the series isolation resistors 34 closer to contact 30 have higher values than those located further away from the contact 30. As an example of an improvement in performance, in a system whose characteristics would only enable the connection of four DUTs 12 to a single test signal using conductive etch 32 alone (no series isolation resistors), the addition of embedded series isolation resistors 34 enables a single test signal to be shared to eight or more DUTs 12, significantly increasing the efficiency of parallel testing of a large number of DUTs 12.

Figure 4:
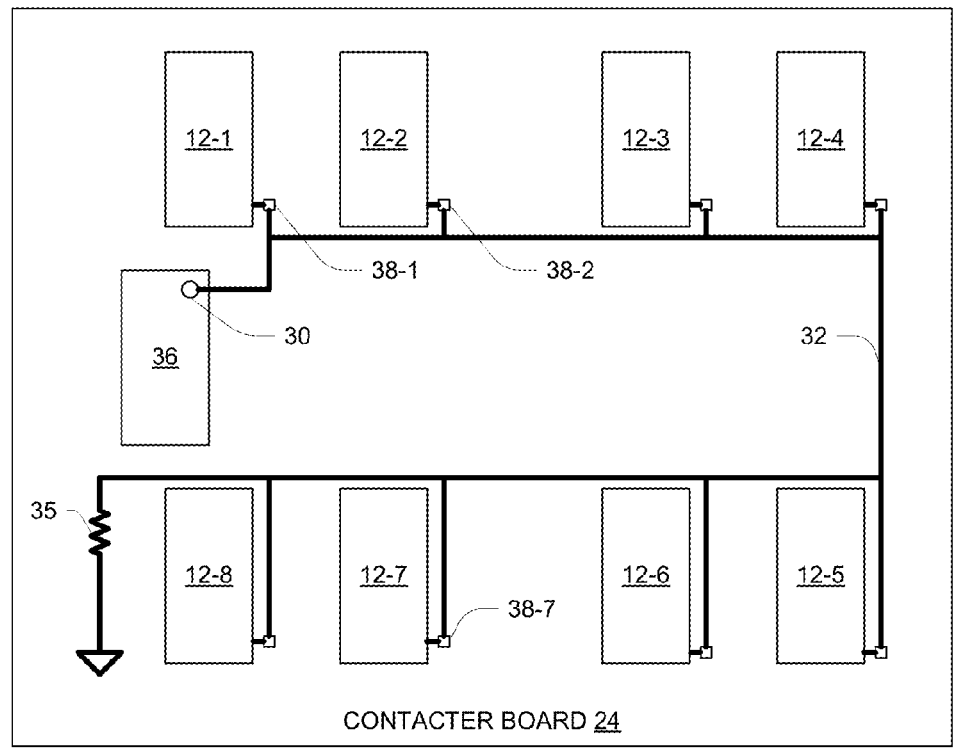
FIG. 4 is a layout diagram depicting a physical layout for a test signal transmission channel.

FIG. 4 illustrates an example of a physical layout of a circuit of the type shown in FIG. 3. The contact 30 is shown as part of a connector 36 to which the interposer 26 of FIG. 1 is connected. The etch 32 is routed in a generally linear fashion on a path past each of eight DUTs 12-1 through 12-8. At each DUT 12, the etch 32 is routed to a respective area 38 (e.g., 38-1, 38-2 etc.), referred to as an "isolation area", where a respective series isolation resistor 34 is formed. Each isolation area 38 is ideally as close as possible to the terminal of the respective DUT 12 to which the signal is to be conveyed (e.g., address terminal A0 of each DUT 12 such as shown in FIG. 3). A small additional piece of etch connects each isolation area 38 with the respective terminal. The configuration of the isolation areas 38 is described below with reference to FIG. 6. In the illustrated embodiment, the distance between neighboring DUTs 12 is in the range of 1-2 inches, and thus the overall length of the etch 32 is on the order of 12 inches or more. It will be appreciated that such a length of etch is sufficiently long that effects caused by signal reflections from the DUTs 12 with spacing greater than signal transition times will cause appreciable noise at signaling rates of 1 Gb/s or higher. The chain of DUTs 12 will have the summation of reflections (from all of the DUT loads present) at different times in different DUT locations. The use of the series isolation resistors 34 significantly reduces such noise by reducing the coupling of signal reflections from the terminals of the DUTs 12 back onto the etch 32. After the last DUT 12 in the chain (e.g. 12-8 as shown), the etch 32 connects to the termination resistor 35.

One feature of the disclosed testing system is that there is generally very little direct-current (DC) component to each of the test signals, and therefore only a small amount of power is dissipated in each of the series isolation resistors 34. As a result, the resistors 34 can be made very small and placed at a fairly high density generally within the outline of the respective DUT 12 on the contacter board 24. Although in the simplified view of FIG. 4 the isolation areas 38 are shown outside the outlines of the DUTs 12, this is only for ease of illustration and it will be appreciated that modern layout and circuit board manufacturing techniques readily permit the placement of sufficiently small embedded resistors 38 within the outlines of the DUTs 12. Specific examples are provided below This close spacing between the series isolation resistors 34 and respective terminals of the DUTs 12 is highly desirable to obtaining good test signal quality.

Figure 5A:
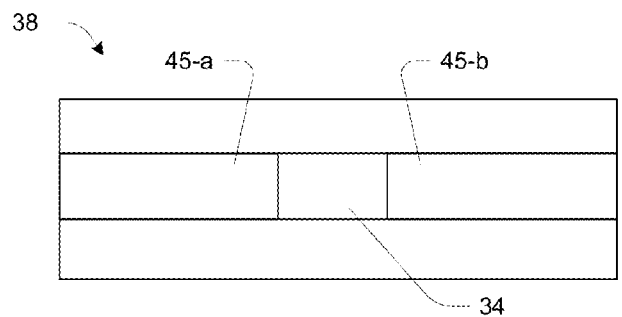
FIGS. 5(a) and 5(b) are depictions of a manner of forming an isolation resistor.
Figure 5B:
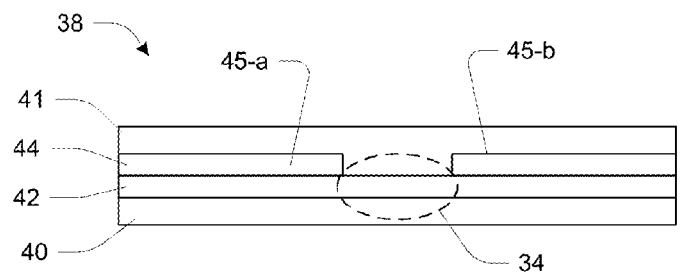

FIGS. 5(a) and 5(b) depict a manner in which an isolation resistor 34 may be formed in an isolation area 38 of the contacter board 24. FIG. 5(a) shows a plan view while FIG. 5(b) shows an elevation view. Several circuit board layers are shown, including insulating layers 40 and 41, a resistor layer 42, and a conductive layer 44. The series isolation resistor 34 is part of the resistor layer 42. Various resistor materials and formation processes may be employed. In one embodiment the resistors 34 are formed of metal thin-film material referred to as "nichrome" (NiCr), formed by a multiple-step etching process. Respective etch segments 45-*a* and 45-*b* are formed as part of the conductive layer 44. The series isolation resistor 34 is formed by a portion of the resistor layer 42 extending across a gap between the ends of the etch segments 45-*a* and 45-*b*. It will be appreciated that one etch segment (e.g. 45-*a*) connects the resistor 34 to the respective DUT 12 while the other (e.g. 45-*b*) connects to the main etch 32 connected to the contact 30 (FIG. 4).

Figure 6:
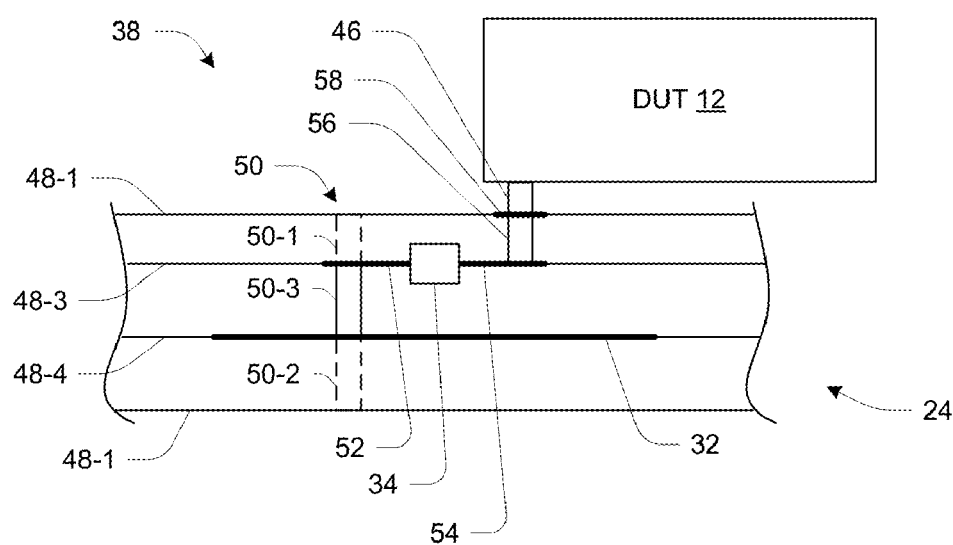
FIG. 6 is a schematic representation of a path from a main test signal etch to an individual terminal of a DUT.

FIG. 6 illustrates details of an isolation area 38 and the manner in which the connecter board 24 provides a connection from the etch 32 to a corresponding terminal 46 of the DUT 12 in one embodiment. The connecter board 24 is a multiple-layer printed circuit board, and FIG. 6 shows top and bottom layers 48-1 and 48-2 as well as two inner layers 48-3 and 48-4. As shown, the connection includes a first via 50, a first trace segment 52, an isolation resistor 34, a second trace segment 54, and a second via 56 which terminates at a contact 58 on the top layer 48-1 that makes contact with the terminal 46 of the DUT 12. In the illustrated arrangement, the first via 50 is a through-hole via that extends all the way through the connector board 24. During manufacture, the first via 50 is "back-drilled" from the top and/or bottom to remove unnecessary via metallization is areas 50-1 and/or 50-2, leaving a remaining portion 50-3 to provide the connection between the layer 48-3 and the layer 48-4. The second via 56 is a so-called "blind" via which extends only from the layer 48-3 to the top layer 48-1.

One important aspect of the presently disclosed technique is the need for a very short path between the etch 32 (which is routed to all DUTs 12) and the terminal 46 of each DUT 12. In the example of FIG. 6, this path includes the via portion 50-3, the first trace segment 52, the isolation resistor 34, the second trace segment 54, and the second via 56. For best performance and acceptably low noise, it is desired that this path for each DUT 12 be as short as possible. It will be appreciated that in any particular embodiment, there is an inherent propagation speed of an electrical signal along a conductive path of the contact board 24. For example, a contacter board 24 may exhibit a characteristic propagation delay of 160 ps/inch, which translates to a propagation speed of one inch per 160 ps. The desired maximum length of each short path between the main etch 32 and the respective signal terminal 46 of a DUT 12, including vias (e.g., 50, 58), traces (e.g., 52 and 56) and the isolation resistor 34, is function of both this propagation speed and the edge rate or signal transition time of the test signal. A predetermined propagation dimension can be defined as the product of the signal transition time of the electrical test signal and the signal propagation speed of the contacter board 24. It is desired that for each isolation area 38, the length of the short path from the etch 32 through the isolation resistor 34 to the respective signal input terminal 46 be less than one-fourth this predetermined propagation dimension.

As one example of the foregoing, if it is assumed that the signal edge rate is 80 ps and the propagation speed is one inch per 160 ps, then the predetermined propagation dimension is 0.5 inches, and the desired limit on path length is one-quarter of this value or ⅛ inch. In general, the test signals in high-speed testing of packaged devices (such as memory devices) have edge rates less than 200 ps, which generally translates to a very tight limitation on the path length. This in turn requires compact component placement and etch routing close to the DUT terminals 46.

Figure 7:
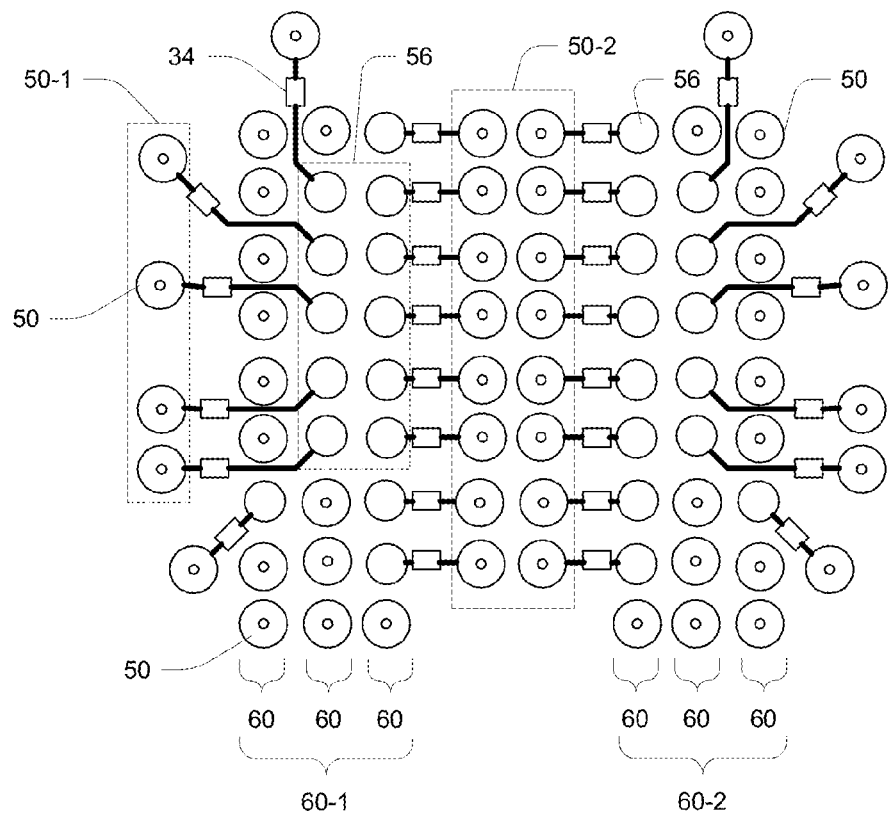
FIG. 7 is a layout view of a portion of a contacter board for contacting DUTs, showing the use of embedded isolation resistors.
Figure 8:
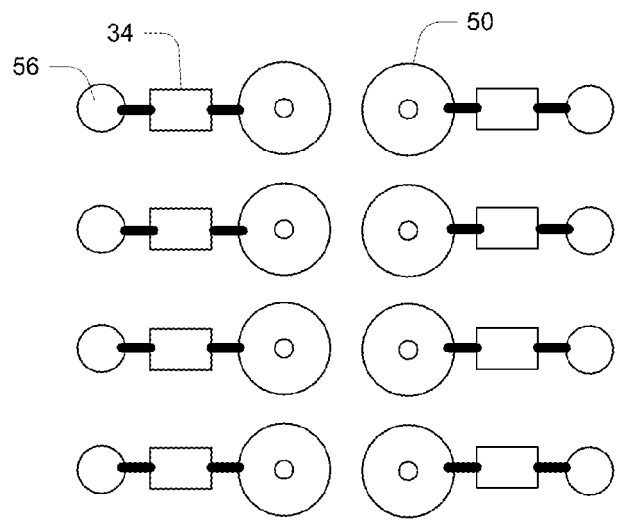
FIG. 8 is a close-up view of a portion of the contacter board of FIG. 7.

FIGS. 7 and 8 are depictions of a layout of an inner layer of the contactor board 24 in the vicinity of a DUT 12 which shows the use of the embedded isolation resistors 34. In both these figures, the small solid rectangles represent the isolation resistors 34, and the larger circles represent through vias such as the first vias 50 discussed above (although these may also include vias making connections to power or ground or to other signal terminals of the DUT 12). The smaller circles represent the "blind" vias 56 that connect each isolation resistor 34 to the respective DUT signal terminal 46.

The layouts in FIGS. 7 and 8 are examples for a specific type of DUT 12, namely a DDR3 semiconductor memory device which as known in the art has an I/O terminal spacing of 0.8 mm. FIG. 7 shows portions of six columns 60 of vias arranged as two sets 60-1, 60-2 of three columns 60 each. These are the DUT vias, i.e., the DUT terminals 46 lie directly above the vias 50, 56 of the columns 60. Other through vias 50 not in the columns 60 (e.g., vias 50-1 at left and vias 50-2 located between the two sets 60-1 and 60-2) are examples of vias providing connections between respective test signal traces such as etch 32 (presumed to be routed on another layer and not shown in FIG. 7 or 8) and a respective isolation resistor 34. The blind vias 56 provide connections between a respective isolation resistor 34 and a respective terminal 46 of the DUT 12. From these diagrams it can be appreciated how compactly the isolation resistors 34 are placed in the vicinity of the DUT terminals to minimize the lengths of the connections to the main etch 32 of each test signal as described above.

While the above description shows the use of planar or horizontal embedded isolation resistors 34, in an alternative approach the isolation resistors may be formed vertically within vias that interconnect different layers of the connecter board. In this approach, resistive material is plated on both surfaces and into the via, then the material is removed from the surfaces (e.g., by abrasion), leaving the resistive material only in the vias. It is preferable to make such resistive vias before the conventional non-resistive vias are drilled, so that those vias receive good copper plating. Also the resistive vias are masked off during the later plating of the non-resistive vias, so that the resistive vias are not plated over with copper. It will be appreciated that using resistive vias may provide for even shorter paths between the etch 32 and each DUT signal terminal.

Figure 9A:
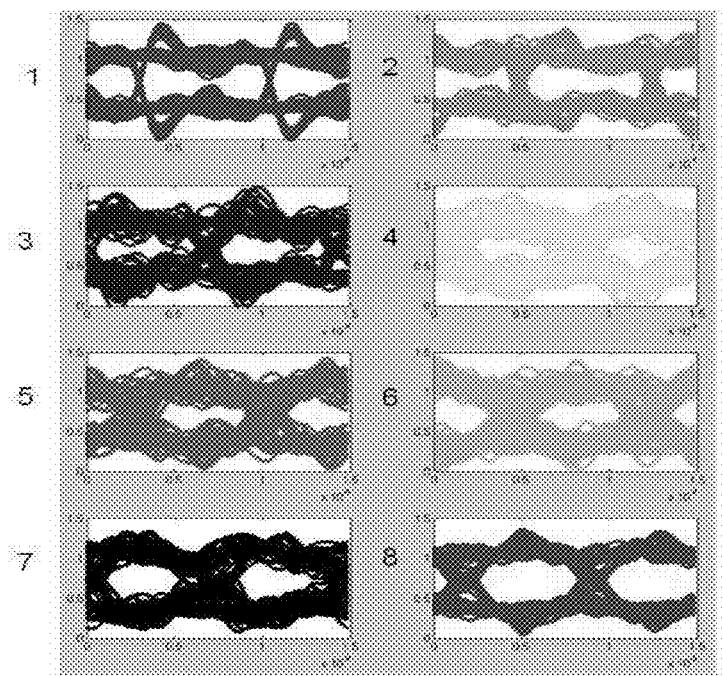
FIGS. 9(a) and 9(b) are waveform diagrams of test signals.
Figure 9B:
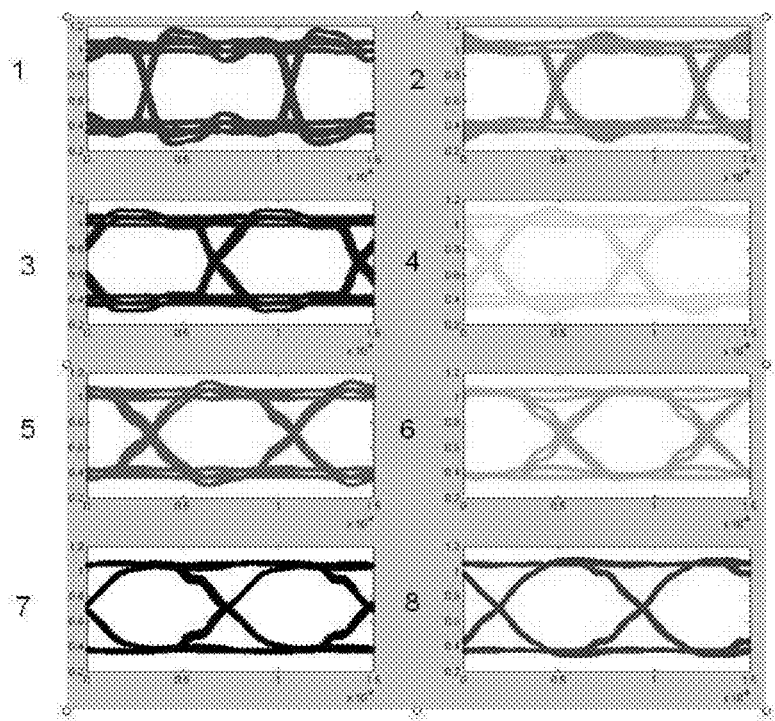

FIGS. 9(*a*) and 9(*b*) illustrate improvements in signal quality that can be obtained using a configuration of the type described herein. These results were obtained by computer simulation of circuit models, and represent so-called "eye diagrams" of signals at the respective terminals of eight DUTs receiving a single high-speed test signal. The numbers on the waveforms in these figures correspond to the position of the DUTs 12 in the chain (see FIG. 4). FIG. 9(*a*) shows the eye diagrams for such signals for a configuration similar to that of FIGS. 3 and 4 but lacking the embedded series isolation resistors 34 (i.e., the etch 32 is directly connected to the respective terminal of each DUT 12). FIG. 9(*b*) shows an eye diagram for such signals in a configuration like that of FIGS. 3 and 4 including the embedded series isolation resistors 34.

The overall quality of a signal represented in an eye diagram is a function of the sizes of the vertical and horizontal openings (areas with no signal presence) of the eye-like pattern formed by the test method. More opening is better for both dimensions. It will be observed that the signals in FIG. 9(*a*) contain significant noise, as reflected in the more closed eye pattern, compared to the signals shown in FIG. 9(*b*), which exhibit much cleaner separation of voltage levels and delineation of signaling intervals. FIG. 9(*a*) shows significant reduction in horizontal opening as well as significant reduction in vertical opening of the eyes compared to FIG. 9(*b*). In particular, many of the signals of FIG. 9(*a*) exhibit a noise amplitude greater than one-quarter the signal amplitude, and for signal number 5 the noise is approaching one-half the signal amplitude. For the signals in FIG. 9(*b*), the noise amplitudes are much lower, less than one-quarter the signal amplitude and in some cases on the order of one-tenth or less of the signal amplitude. Thus, the use of the series isolation resistors has reduced noise by one-half or more over an otherwise similar test channel.

While various embodiments of the invention have been particularly shown and described, it will be understood by those skilled in the art that various changes in form and details may be made therein without departing from the spirit and scope of the invention as defined by the appended claims.

For example, in different embodiments is may be desirable to either utilize or refrain from utilizing so-called "trimming" for accuracy of the resistance values of the embedded series isolation resistors 38. In many applications, it may be that the resistors 38 as formed by the etch/deposition process are sufficiently accurate to achieve desired results, and in such cases no separate trimming operation would be necessary. In other applications it may be desired to employ a trimming process to bring each resistor 38 closer to a desired value. Such trimming techniques are generally known and not elaborated here.

It should be noted that the series isolation resistors 34 are distinct from, and may be used either with or without, other circuit elements such as protection circuitry (including resistors) that may be formed on the DUTs 12.

The technique is disclosed as used with SDRAMs in particular as DUTs, but those skilled in the art will appreciate that it can be used with other types of DUTs where it is possible to share test signals among the DUTs. Also, in any given application the exact number of DUTs driven by a single test signal will be a function of a number of variables and will not be limited to the specific examples discussed above.

While FIGS. 3 and 4 might suggest that the etch 32 forms a relatively long single path along which all the DUTs 12 are arrayed in serial fashion, in alternative embodiments it might be desired to use other configurations, consistent with signal routing requirements and good signal integrity practice. Other departures from the specifics described herein are possible within the scope of the invention as claimed.

What is claimed is:

1. Automated test equipment for high-speed testing of packaged integrated circuit (IC) devices, each packaged IC device including a semiconductor IC and a package providing mechanical mounting of and external connections for the semiconductor IC, the external connections including a respective signal input terminal having package parasitic reactance, comprising:

a tester channel circuit operative to generate an electrical test signal to be applied to the signal input terminal of each of the packaged ICs, the electrical test signal having a signal transition time less than 200 ps; and a contacter board configured to make physical and electrical contact with the packaged IC devices, the contacter board having a characteristic signal propagation speed, the contacter board having a signal transmission channel including (1) an electrical contact at which the electrical test signal is received, (2) conductive etch extending from the electrical contact to a plurality of isolation areas, each isolation area being adjacent to the signal input terminal of a respective one of the packaged IC devices, and (3) a plurality of embedded series isolation resistors each formed within the contacter board at a respective isolation area and being connected between the conductive etch and the adjacent signal input terminal, wherein a predetermined propagation dimension is defined as the product of the signal transition time of the electrical test signal and the signal propagation speed of the contacter board, and wherein for each isolation area the length of a respective signal path from the conductive etch to the isolation resistor, through the isolation resistor and then to the signal input terminal is less than one-fourth the predetermined propagation dimension.

2. Automated test equipment according to claim 1, wherein each of the series isolation resistors includes a portion of a planar resistor layer formed as an inner layer of the contacter board, the portion extending across a gap between respective ends of segments of conductive etch contacting the portion.

3. Automated test equipment according to claim 1, wherein each of the series isolation resistors is formed vertically within a respective resistive via interconnecting different layers of the connecter board, each resistive via including resistive material disposed within the via.

4. Automated test equipment according to claim 1, wherein the presence of the series isolation resistors contributes to a reduction of noise on the signal transmission channel by at least one-half relative to an otherwise identical signal transmission channel lacking the series isolation resistors.

5. Automated test equipment according to claim 1, wherein the conductive etch is terminated at one end by a termination resistor having a resistance equal to an effective impedance of the conductive etch and associated loads attached to the conductive etch, the associated loads including the series isolation resistors and the package parasitic reactance of the signal input terminal of each packaged IC device connected to the conductive etch.

6. Automated test equipment according to claim 1, wherein the resistance of the series isolation resistors is less than 50 ohms.

7. Automated test equipment according to claim 1, wherein at least some of the series isolation resistors have unequal resistance values.

8. Automated test equipment according to claim 7, wherein the resistance of those series isolation resistors located closer to the electrical contact at which the electrical test signal is received is greater than resistance of those series isolation resistors located farther from the electrical contact at which the electrical test signal is received.

9. Automated test equipment according to claim 1, wherein the conductive etch is routed along a linear path interconnecting all the isolation areas.

10. Automated test equipment according to claim 1, wherein the series isolation resistors are configured to be trimmed in a trimming process to provide more accurate final resistance values over initial resistance values prior to the trimming process.

11. A contacter board for use in high-speed testing of packaged integrated circuit (IC) devices, each packaged IC device including a semiconductor IC and a package providing mechanical mounting of and external connections for the semiconductor IC, the external connections including a respective signal input terminal having package parasitic reactance, the high-speed testing including the use of an electrical test signal to be applied to the signal input terminal of each of the packaged ICs, the electrical test signal having a signal transition time less than 200 ps, comprising:

electrical contacts configured to make physical and electrical contact with the packaged IC devices; and a signal transmission channel including (1) an electrical contact at which the electrical test signal is received, (2) conductive etch extending from the electrical contact to a plurality of isolation areas, each isolation area being adjacent to the signal input terminal of a respective one of the packaged IC devices, and (3) a plurality of embedded series isolation resistors each formed within the contacter board at a respective isolation area and being connected between the conductive etch and the adjacent signal input terminal, wherein the contacter board has a characteristic signal propagation speed and a predetermined propagation dimension is defined as the product of the signal transition time of the electrical test signal and the signal propagation speed of the contacter board, and wherein for each isolation area the length of a respective signal path from the conductive etch through the isolation resistor to the signal input terminal is less than one-fourth the predetermined propagation dimension.

12. A contacter board according to claim 11, wherein each of the series isolation resistors includes a portion of a planar resistor layer formed as an inner layer of the contacter board, the portion extending across a gap between respective ends of segments of conductive etch contacting the portion.

13. A contacter board according to claim 11, wherein each of the series isolation resistors is formed vertically within a respective resistive via interconnecting different layers of the connecter board, each resistive via including resistive material disposed within the via.

14. A contacter board according to claim 11, wherein the presence of the series isolation resistors contributes to a reduction of noise on the signal transmission channel by at least one-half relative to an otherwise identical signal transmission channel lacking the series isolation resistors.

15. A contacter board according to claim 11, wherein the conductive etch is terminated at one end by a termination resistor having a resistance equal to an effective impedance of the conductive etch and associated loads attached to the conductive etch, the associated loads including the series isolation resistors and the package parasitic reactance of the signal input terminal of each packaged IC device connected to the conductive etch.

16. A contacter board according to claim 11, wherein the resistance of the series isolation resistors is less than 50 ohms.

17. A contacter board according to claim 11, wherein at least some of the series isolation resistors have unequal resistance values.

18. A contacter board according to claim 17, wherein the resistance of those series isolation resistors located closer to the electrical contact at which the electrical test signal is received is greater than resistance of those series isolation resistors located farther from the electrical contact at which the electrical test signal is received.

19. A contacter board according to claim 11, wherein the conductive etch is routed along a linear path interconnecting all the isolation areas.

20. A contacter board according to claim 11, wherein the series isolation resistors are configured to be trimmed in a trimming process to provide more accurate final resistance values over initial resistance values prior to the trimming process.

* * * * *